US006847264B2

(12) United States Patent
Juerschik

(10) Patent No.: US 6,847,264 B2
(45) Date of Patent: Jan. 25, 2005

(54) METHOD FOR GENERATING WANDER OR WANDER SEQUENCES

(75) Inventor: Dietmar Juerschik, Kempten (DE)

(73) Assignee: Siemens Aktiengesellschaft, Munich (DE)

(*) Notice: Subject to any disclaimer, the term of this patent is extended or adjusted under 35 U.S.C. 154(b) by 21 days.

(21) Appl. No.: 10/221,492

(22) PCT Filed: Apr. 27, 2001

(86) PCT No.: PCT/DE01/01621

§ 371 (c)(1),
(2), (4) Date: Jul. 9, 2003

(87) PCT Pub. No.: WO01/82482

PCT Pub. Date: Nov. 1, 2001

(65) Prior Publication Data

US 2004/0041637 A1 Mar. 4, 2004

(30) Foreign Application Priority Data

Apr. 27, 2000 (DE) ......................... 100 20 686

(51) Int. Cl.[7] .............................................. H04B 3/46
(52) U.S. Cl. ............................ 331/2; 702/69; 375/226; 331/16
(58) Field of Search ................................. 331/2, 16, 46; 702/69; 708/101, 103; 327/113, 115; 375/226

(56) References Cited

U.S. PATENT DOCUMENTS 3,885,138 A    5/1975  Bates .......................... 708/8
4,349,887 A    9/1982  Crowley ...................... 708/103
5,757,652 A    5/1998  Blazo et al. .................. 702/69
6,621,860 B1 * 9/2003  Yamaguchi et al. ......... 375/226
6,795,496 B1 * 9/2004  Soma et al. ................. 375/226

FOREIGN PATENT DOCUMENTS

EP        0 828 343 A1      3/1998

OTHER PUBLICATIONS

"The Control of Jitter and Wander Within Digital Networks Which are Based on the 2048kbit/s Hierarchy," ITU–T Recommendation G.823, International Telecommunication Union, 1993.

* cited by examiner

Primary Examiner—Robert Pascal
Assistant Examiner—Joseph Chang
(74) Attorney, Agent, or Firm—Morrison & Foerster LLP

(57) ABSTRACT

According to the invention, a frequency demultiplication circuit serves to generate wander or wander sequences having frequencies of less than 10 Hz and, in particular, less than 1 Hz. Said frequency demultiplication circuit receives, on the input side, pulse signals of a relatively high frequency and has two counter arrays (C11, C12; C21, C22) and a phase comparator circuit (COMg) that is connected to the outputs of said counter arrays. The counting cycle of one counter array (C22) is modified with regard to the counting cycle of the other counter array (C12) within a period of the respective wander to be generated or of the respective wander sequence to be generated according to a desired progression of the wander or of the wander sequence.

5 Claims, 2 Drawing Sheets

METHOD FOR GENERATING WANDER OR WANDER SEQUENCES

This application claims priority to International Application No. PCT/DE01/01621, which was published in the German language on Nov. 1, 2001.

TECHNICAL FIELD OF THE INVENTION

This invention relates to a circuit arrangement to produce wander or wander sequences.

BACKGROUND OF THE INVENTION

Wander and wander sequences with a frequency below 10 Hz are used in the testing and measurement technologies to investigate the behavior of signal transmission circuits toward signals with very long periods. Thus, the use of wander or wander sequences in connection with synchronous digital signal transmission is required, as for example is indicated in the ITU-T Recommendation G.823 (03/93).

Up to this point, wander or wander sequences of the type cited above could only be produced through relatively high degrees of device engineering. In the process, function-modulating and frequency-modulating signal generators were used, which, however, led to the required wander amplitudes being issued at low clock frequencies and in all cases with a very high degree of circuitry.

SUMMARY OF THE INVENTION

This invention relates to a circuit arrangement to produce wander or wander sequences that have frequencies below 10 Hz, in particular below 1 Hz, with a frequency divider circuit that receives impulse signals of relatively high frequency as incoming inputs and that issues impulse signals of divided frequency at its output side from which the respective wander or the respective wander sequence is built.

The invention discloses a circuit arrangement of the type cited above with relatively little circuitry to produce wander or wander sequences whose frequencies lie below 10 Hz and preferably below 1 Hz.

According to one embodiment of the invention, there is a circuit arrangement where the frequency division circuit has two individual dividers, each of which encompasses a counting arrangement that receives as incoming inputs the impulse signals mentioned having the relatively high frequency, the count cycle of one counting arrangement is changed with respect to the count cycle of the other counting arrangement within the period of the respective wander or wander sequence to be produced according to a desired shape of this wander or wander sequence, and a phase comparator circuit is connected at the outputs of the two counting arrangements, from the output of which the respective wander or the respective wander sequence can be taken.

One advantage of the invention is an especially low amount of circuitry in producing wander or wander sequences below 10 Hz and preferably below 1 Hz. Using two counting arrangements, and by changing the count cycle of one counting arrangement with respect to the count cycle of the other counting arrangement in the manner described, the prerequisites are met for obtaining the respective desired wander or wander sequence by means of a phase comparator circuit connected after the outputs of the two counting arrangements.

To this end, a low pass filter is connected after the phase comparator circuit mentioned. This provides the advantage in that the respective wander or respective wander sequence obtains a desired smooth shape.

It is preferable for each counting arrangement to be connected at the output of its own oscillator circuit. In this way, other changes can be made in the respective wander or wander sequence if necessary by correspondingly controlling at least one of the two oscillator circuits.

A particular advantage is if each oscillator circuit belongs to a separate PLL circuit. In this way, the respective wander or wander sequence can be produced with very good stability, i.e., with very low jitter. Due to the resultant influence on the counting arrangement in the output circuit of one of the PLL circuits, the required output amplitude of the respective wander or wander sequence to be produced can be produced with a high degree of stability by changing the counter value of the affected counting arrangement within a defined count cycle.

BRIEF DESCRIPTION OF THE DRAWINGS

The invention is explained in more detail below with the help of the drawings as an example.

DETAILED DESCRIPTION OF THE INVENTION

Figure 1:
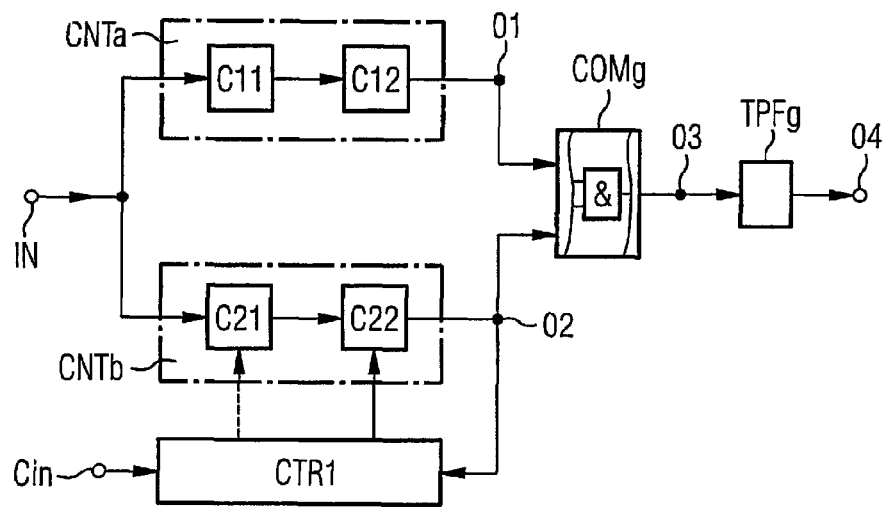
FIG. 1 shows a block diagram of a first exemplary embodiment of the circuit arrangement according to the invention.

The circuit arrangement shown in FIG. 1 illustrates a first exemplary embodiment, according to the invention, and encompasses a frequency division circuit that has two individual dividers CNTa, CNTb, each of which encompasses a counting arrangement, and to which input impulses of relatively high frequency, for example impulses with a frequency of 8 kHz, are fed at a common input connection IN that can be derived from impulses with a frequency of, for example, 16,384 MHz. The generator circuit that produces these impulses operate at very high precision ($10^{-12}$) so as to be able to make available the desired wander or wander sequences. Each of the two individual dividers mentioned, CNTa, CNTb —which basically both have the same division ratio, i.e., are built in the same way —includes a counting arrangement that is made up of two partial, or individual counters C11, C12 and C21, C22 connected in series, of which the partial counters C11, C21 perform a first coarse division of the input impulses and of which the partial counters C12, C22 execute the final conversion. In principle, each counting arrangement can also be made up of only one counter.

Control outputs of a control circuit CTR1 are connected to adjustment inputs of the partial counter C22 belonging to the individual divider CNTb and, if necessary, also to adjustment inputs of the partial counter connected to it, C21. The affected control circuit CTR1 is connected to a control input at an input connection Cin and to a signal input at the output of the partial counter C22. By means of this control circuit CTR1, the count cycle of at least partial counter C22 can be changed with respect to the count cycle of its corresponding partial counter C12 belonging to the other individual divider CNTa within the determined period of the respective wander or wander sequence to be produced according to a desired shape of this wander or wander sequence, as is further explained below in connection with FIGS. 3 and 4.

At the outputs 01 and 02 of the two individual dividers CNTa and CNTb is a phase comparator circuit COMg, the input side of which is connected according to FIG. 1. At the output 03 of this phase comparator circuit COMg, which is indicated as a circuit containing an AND gate, a low pass filter TPFg is connected whose output is connected to an output 04 of the circuit arrangement.

The respective desired wander or wander sequences can be taken at the two outputs 03 and 04 just mentioned. More detail will be provided on this in connection with FIG. 4.

Figure 2:
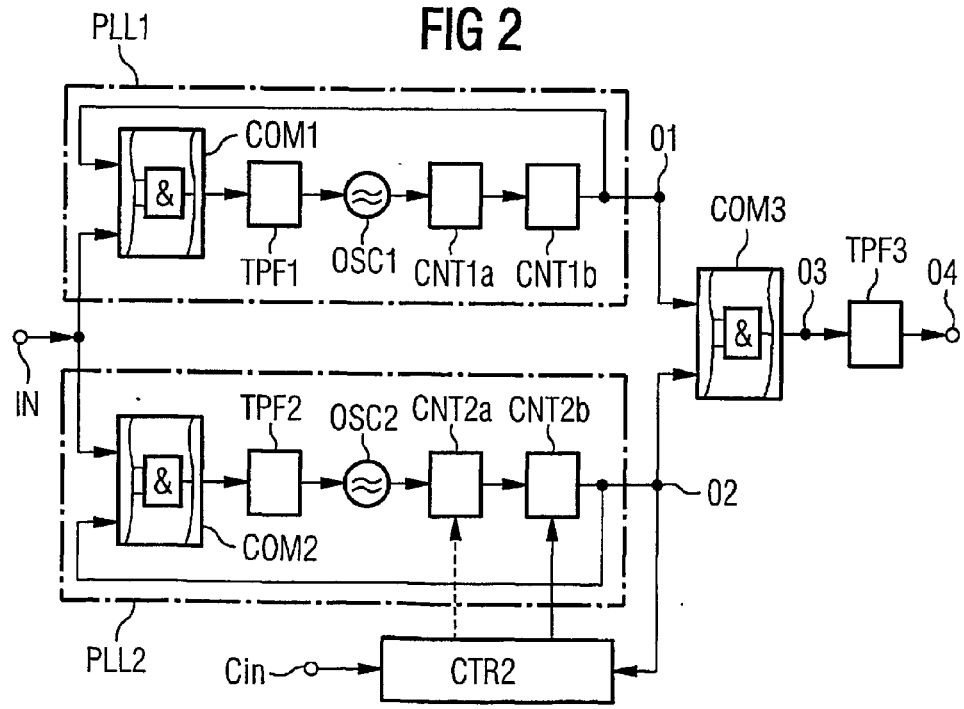
FIG. 2 shows a block diagram of a second exemplary embodiment of the circuit arrangement according to the invention.

FIG. 2 shows a further development of the circuit arrangement shown in FIG. 1 as a second exemplary embodiment of the invention. According to FIG. 2, the counting arrangements includes two partial counters each, or CNT1*a* and CNT1*b* and CNT2*a* and CNT2*b* —for which the same specifications apply that had been made with respect to the partial counters CNTa, CNTb according to FIG. 1 —are each connected to the output of a separate oscillator circuit OSC1 and OSC2; the inputs of the two oscillator circuits OSC1 and OSC2 are each connected to the output of a low pass filter TPF1 and TPF2.

Each of the two oscillator circuits OSC1 and OSC2 belongs to a separate PLL circuit, PLL1 and PLL2, within which they are each connected to the output of an associated phase comparator circuit COM1 and COM2 with its respective low pass filter TPF1 and TPF2. These phase comparator circuits COM1 and COM2 are connected in common through one of their inputs to an input terminal identified by IN, to which, in this case, input signals are fed having relatively high frequency, for example impulses with a frequency of 8 kHz, which can be derived from impulses with a frequency of 16,384 MHz, for example. The generator circuit producing these impulses must also operate here with very high precision ($10^{-12}$) in order to be able to make available the desired wander or wander sequences. The 8 kHz input signal mentioned provides reference impulses or signals in the circuit arrangement according to FIG. 2. The other inputs of both phase comparator circuits COM1 and COM2, each of which is likewise represented as a circuit containing an AND gate, are connected to an output of the counting arrangement that is connected after the respective oscillator circuit OSC1 and OSC2. In this case, the outputs 01 and 02 of the partial counters CNT1*b* and CNT2*b* are connected to the applicable inputs of the phase comparator circuit COM1 and COM2. However, it is, in principle, also possible to connect the outputs of the other partial counters CNT1*a* and CNT2*a* to the applicable inputs of said phase comparator circuits COM1 and COM2.

As in the circuit arrangement shown in FIG. 1, control inputs of at least the partial counter CNT2*b* and, if necessary, also of partial counter CNT2*a*, are connected to control outputs of a control circuit CTR2 in the circuit arrangement shown in FIG. 2. These control outputs can correspond to the control circuit CTR1 shown in FIG. 1. Accordingly, the applicable control circuit CTR2 is connected to a control input at an input terminal Cin and to a signal input at output 02 of the partial counter CNT2*b*.

A phase comparator circuit COM3 is connected after the two counters shown in FIG. 2 to their outputs and includes on one hand the partial counters CNT1*a* and CNT1*b*, and on the other the partial counters CNT2*a*, CNT2*b*. At the output 03 of the phase comparator circuit, a low pass filter TPF3 is connected after it, whose output is connected to an output 04. The phase comparator circuit COM3 and the low pass filter TPF3 correspond to the phase comparator circuit COMg and the low pass filter TPFg in the circuit arrangement shown in FIG. 1.

Figure 3:
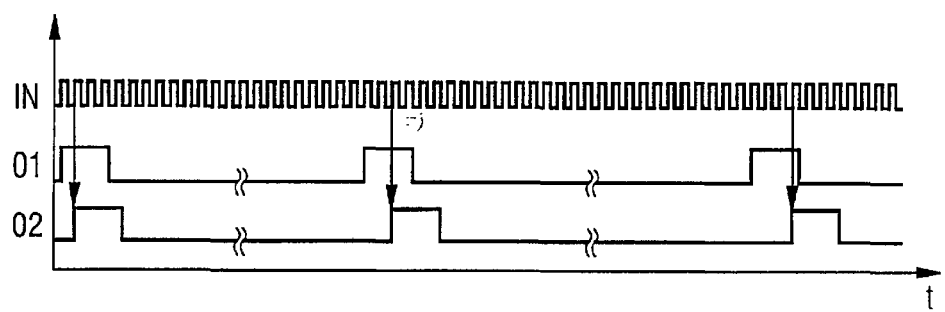
FIG. 3 shows a diagram of the temporal shape of impulses or signals that occur at various points in the circuit for the circuit arrangement illustrated in FIGS. 1 and 2.
Figure 4:
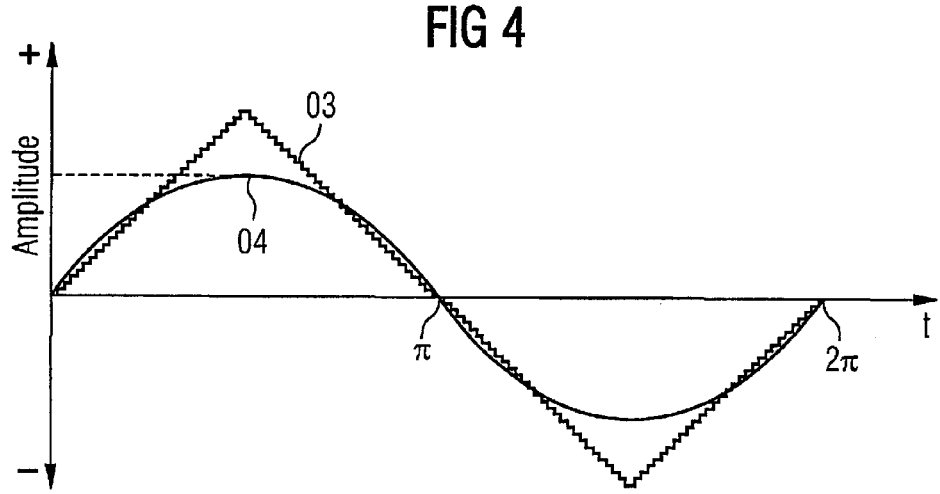
FIG. 4 shows a diagram of the temporal shape of the wander or of a wander sequence that occurs at other points in the circuit for the circuit arrangement illustrated in FIGS. 1 and 2.

FIGS. 3 and 4 explain the principle of generating wander or wander sequences as it is applied to this invention. In this regard, mention should be made that in principle both circuit arrangements according to FIGS. 1 and 2 operate in the same manner with regard to the generation of wander or wander sequences with very small frequencies below 10 Hz, and preferably below 1 Hz.

The diagram shown in FIG. 3 shows impulses or signals occurring at various circuit points of the circuit arrangements illustrated in FIG. 1 and FIG. 2 along the time axis t. In the row identified by IN are the input impulses occurring at the input terminals IN in the circuit arrangements according to FIGS. 1 and 2 that may occur with a relatively high frequency of 8 kHz and which can be derived from a signal with a frequency of 16,384 MHz, for example. In the case of the circuit arrangement according to FIG. 1, these input impulses experience a frequency division in both partial counters CNTa and CNTb, so that final output signals occur at the outputs 01 and 02 indicated in FIG. 1 that are illustrated in the correspondingly named rows in FIG. 3, for example with a frequency of 8 kHz each. The same applies for the partial counters CNT1*a*, CNT1*b* and CNT2*a*, CNT2*b* in the circuit arrangement according to FIG. 2.

According to FIG. 3, the leading edges of the impulses indicated in row 02 are shifted with respect to the leading edges of the corresponding impulses in row 01 by one cycle each of the impulses shown in the upper row IN in FIG. 3 relative to the preceding time of observation shown, respectively. This shift occurs according to FIG. 3 relative to the impulses shown in row 01 in one direction (to the right in FIG. 3). In the process, the change in this direction can occur over a time frame corresponding to n/2 of the period of the wander or wander sequence to be issued, whereupon a change in the applicable leading edges of the impulses shown in row 02 can then occur with respect to the leading edges of the impulses shown in row 01 in the other direction (i.e., according to FIG. 3 to the left) during a duration of n within the period of the wander or wander sequence to be issued. Then, a change can again finally take place in the leading edges of the impulses shown in row 02 relative to the leading edges of the corresponding impulses shown in row 01 in FIG. 3 in the manner explained above (i.e., to the right in FIG. 3) during a duration of n/2 within the period of the wander or wander sequence to be issued.

The shift explained above in the leading edges of the impulses of the output signal shown in row 02 in FIG. 3 with respect to the leading edges of the impulses of the output signal shown in row 01 in FIG. 3 occurs by correspondingly adjusting the partial counter C22 shown in FIG. 1 or of the partial counter CNT2*a* shown in FIG. 2 by means of the control circuit CTR1 or CTR2 connected to its control inputs. In the process, this control circuit CTR1 or CTR2 changes, firstly, the count cycle of the applicable partial counter C22 or CNT2*a* with respect to the count cycle of the other corresponding partial counter C12 or CNT1*a* within the period of the wander or of the wander sequence to be produced, and secondly, this change occurs according to the desired shape of this wander or wander sequence. In order to further clarify this statement, reference is made to the diagram shown in FIG. 4.

The diagram according to FIG. 4 shows in an amplitude-time axis diagram the temporal shape of the output signals occurring at the output O3 and at output O4 in the circuit arrangement according to FIG. 1 and FIG. 2 (wander or wander sequence) along the time axis t. In the process, the output signal occurring at the output, i.e., output terminal O3 shows a triangular shaped curve having a positive value within the time frame from 0 to n and a negative shape within the time frame from n to 2n directly adjacent to it. The time frame from 0 to 2n represents one period of the wander or wander sequence to be produced.

The triangular shaped output signal with the stepped stages is produced based on the relationships that had been explained before in connection with FIG. 3, with respect to the impulses or output signals shown in rows O1 and O2. In the process, the respective step height (amplitude) of this output signal shown in FIG. 4 by O3 depends on the phase difference between the output signals occurring in rows O1 and O2 according to FIG. 3, and accordingly at the corresponding circuit points according to FIG. 1 and FIG. 2, the output signals being processed by the phase comparator circuit COMg or COM3. However, the respective step width (in the direction of the time axis) depends on the duration during which the amplitude mentioned before is to be issued within the period (0–2n) of the wander or wander sequence to be produced. This means that a corresponding adjustment of the partial counter C22 occurs by means of the control circuit CTR1 or CTR2 for this duration.

In order to be able to execute the adjustment of the partial counter C22 mentioned, a corresponding control signal can be fed to the control circuit CTR1 at its control input or input terminal Cin, which first establishes the respective duration during which the respective adjustment of the partial counter C22 or CNT2a is to remain (step width), and which secondly establishes the number of changes of the partial counter C22 or CNT2a for the change of its counter position relative to the counter position of the other corresponding partial counter C12 or CNT1a (amplitude), as had been explained in connection with FIG. 3. To be able to execute this control action, the control circuits CTR1 and CTR2 are each connected to a signal input at the circuit point or output O2 according to FIGS. 1 and 2.

The sinusoidal output signal O4 is then formed from the output signal O3 shown in FIG. 4 by means of the low pass filter TPFg or TPF3 in the circuit arrangement according to FIG. 1 or according to FIG. 2, which is issued by the corresponding output or output terminal O4 of the circuit arrangement according to FIGS. 1 and 2. This means that a smoothing of the triangular output signal O3 leads to output signal O4. A corresponding smoothing of the output signal of the phase comparator circuit COM2 takes place as well in the circuit arrangement shown in FIG. 2 by means of the low pass filter TPF2. This smoothing results in a stable control voltage being fed to the oscillator circuit OSC 2 according to FIG. 2, which leads to the issuance of an oscillator output signal with stable frequency.

Based on the count values given above for the impulses occurring at the respective input terminal IN as well as at the outputs O1 and O2 in the circuit arrangements according to FIGS. 1 and 2, a wander or wander sequence can be obtained from the output O3 or O4 of this circuit arrangement, as shown in FIG. 4 with a frequency of 12 $\mu$Hz, for example, which corresponds to a period T=23,148 h. In the process, the shape shown in FIG. 4 of the wander sequence can occur [be produced] in 295 steps for example (time axis t).

Finally, mention is made that the phase comparator circuits contained in the circuit arrangements shown in FIGS. 1 and 2 are preferably phase-sensitive phase comparator circuits, i.e., phase detectors or Type 2 PD systems as they are called in the literature (see for example the book "Einf óhrung in die PLL-Technik,"[Introduction to PLL Technology], H. Geschwinde, Verlag Priedr. Vieweg & Sohn, Braunschweig/Wiesbaden, 1980, beginning at page 118, and the book "Theorie und Anwendung des phase-locked-loops" [Theory and Application of Phase Locked Loops], Roland Best, AT Verlag Aarau/Schweiz, 1993, pages 96–99).

Otherwise, the circuit arrangement according to the invention is not just suited for the generation of sinusoidal wander or wander sequences, as had been described above, but that in general also wander or wander sequences with other forms can be generated. As can be seen, the establishment of these forms occurs through correspondingly issuing control signals from the control circuit CTR1 or CTR2 in the circuit arrangements according to FIGS. 1 and 2, which are separately controlled from them. Referring to the circuit arrangement according to FIG. 2, it should also be mentioned that its oscillator circuits OSC1 and OSC2 can be separately adjusted if necessary in order to generate an even larger variety of wander or wander sequences than is possible using the control circuit CTR2.

What is claimed is:

1. A circuit to produce wander or wander sequences having frequencies below 10 Hz comprising; a frequency divider circuit that receives impulse signals of relatively high frequency as incoming inputs and issues impulse signals of divided frequency as its output, from which the respective wander or wander sequence is formed, the frequency division circuit having two dividers, each of which encompasses a counting arrangement, both of which receive as incoming inputs the impulse signals mentioned having the relatively high frequency, the count cycle of one counting arrangement is changed with respect to the count cycle of the other counting arrangement within the period of the respective wander or wander sequence to be produced according to a desired shape of the wander or wander sequence; and a phase comparator circuit is connected to outputs of both counting arrangements, from the output of which the respective wander or the respective wander sequence can be taken.

2. The circuit arrangement according to claim 1, wherein a low pass filter is connected after the phase comparator circuit.

3. The circuit arrangement according to claim 1, wherein each counting arrangement is connected to the output of its own oscillator circuit.

4. The circuit arrangement according to claim 3, wherein each oscillator circuit belongs to a separate PLL circuit.

5. The circuit arrangement according to claim 2, wherein each counting arrangement is connected to the output of its own oscillator circuit.

* * * * *